United States Patent
Iida et al.

(10) Patent No.: US 11,515,552 B2
(45) Date of Patent: Nov. 29, 2022

(54) CATALYST LAMINATE, MEMBRANE ELECTRODE ASSEMBLY, ELECTROCHEMICAL CELL, STACK, WATER ELECTROLYZER, AND HYDROGEN UTILIZING SYSTEM

(71) Applicant: Kabushiki Kaisha Toshiba, Minato-ku (JP)

(72) Inventors: Atsuko Iida, Yokohama Kanagawa (JP); Norihiro Yoshinaga, Yokohama Kanagawa (JP); Wu Mei, Yokohama Kanagawa (JP); Yoshihiko Nakano, Yokohama Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 95 days.

(21) Appl. No.: 16/293,170

(22) Filed: Mar. 5, 2019

(65) Prior Publication Data

US 2019/0296380 A1  Sep. 26, 2019

Related U.S. Application Data

(63) Continuation-in-part of application No. 16/130,401, filed on Sep. 13, 2018, now abandoned.

(30) Foreign Application Priority Data

Mar. 22, 2018 (JP) .............................. JP2018-054819
Sep. 18, 2018 (JP) .............................. JP2018-174051

(51) Int. Cl.
*H01M 8/1004* (2016.01)
*H01M 4/86* (2006.01)
(Continued)

(52) U.S. Cl.
CPC ....... *H01M 8/1004* (2013.01); *C23C 14/0036* (2013.01); *C23C 14/083* (2013.01);
(Continued)

(58) Field of Classification Search
CPC .................................................... C25B 11/0484
See application file for complete search history.

(56) References Cited

U.S. PATENT DOCUMENTS 9,406,941 B2    8/2016  Mei et al.
2008/0067125 A1*  3/2008  Wilkins ................ C02F 1/4695
                                                    210/641
(Continued)

FOREIGN PATENT DOCUMENTS

JP    2008-293705 A    12/2008
JP    2009-99520 A     5/2009
(Continued)

OTHER PUBLICATIONS

Partial machine translation of Kono et al. JP 2016193800 A (Year: 2020).*

(Continued)

*Primary Examiner* — Ryan S Cannon
(74) *Attorney, Agent, or Firm* — Oblon, McClelland, Maier & Neustadt, L.L.P.

(57) ABSTRACT

A catalyst laminate includes a plurality of catalyst layers containing at least one of a noble metal and an oxide of the noble metal and at least one of a non-noble metal and an oxide of the non-noble metal, including:

two or more first catalyst layers and two or more second catalyst layers. In an atomic percent of the noble metal obtained by using a line analysis by energy dispersive X-ray spectroscopy in a thickness direction of the catalyst laminate. The first catalyst layer is less than an average of a highest value and a lowest value of the atomic percent (Continued)

of the noble metal. The second catalyst layer has an atomic percent of the noble metal equal to or greater than the average of the highest value and the lowest value thereof. The second catalyst layer is present between the first catalyst layers.

26 Claims, 8 Drawing Sheets

(51) Int. Cl.
  *C23C 14/00* (2006.01)
  *C23C 14/08* (2006.01)
  *C23C 14/18* (2006.01)
  *C25B 1/04* (2021.01)
  *C25B 9/73* (2021.01)
  *C25B 11/093* (2021.01)

(52) U.S. Cl.
  CPC .............. *C23C 14/185* (2013.01); *C25B 1/04* (2013.01); *C25B 9/73* (2021.01); *C25B 11/093* (2021.01); *H01M 4/8657* (2013.01)

(56) References Cited

U.S. PATENT DOCUMENTS

| | | | |
|---|---|---|---|
| 2008/0230171 | A1 | 9/2008 | Mei et al. |
| 2010/0021787 | A1 | 1/2010 | Wu et al. |
| 2010/0239950 | A1 | 9/2010 | Mei et al. |
| 2010/0252441 | A1* | 10/2010 | Chidsey ................ C25B 1/26 205/335 |
| 2010/0330452 | A1 | 12/2010 | Paik et al. |
| 2012/0178614 | A1* | 7/2012 | Parida ................. B01J 35/004 502/62 |
| 2012/0251915 | A1* | 10/2012 | Mei .................... H01M 4/8605 429/479 |
| 2013/0017473 | A1* | 1/2013 | Kim ....................... H01M 4/90 429/524 |
| 2013/0186750 | A1* | 7/2013 | Urgeghe ............. C25B 11/0484 204/242 |
| 2013/0252132 | A1 | 9/2013 | Mei et al. |
| 2016/0087282 | A1 | 3/2016 | Mei et al. |
| 2017/0183788 | A1 | 6/2017 | Iida et al. |

FOREIGN PATENT DOCUMENTS

| | | |
|---|---|---|
| JP | 2010-33759 A | 2/2010 |
| JP | 4740179 B2 | 5/2011 |
| JP | 4861445 B2 | 11/2011 |
| JP | 2012-204221 A | 10/2012 |
| JP | 5342824 B2 | 8/2013 |
| JP | 2013-226537 A | 11/2013 |
| JP | 2014-78356 A | 5/2014 |
| JP | 5676334 B2 | 1/2015 |
| JP | 2016-62857 A | 4/2016 |
| JP | 6047380 B2 | 11/2016 |
| JP | 2016193800 A * | 11/2016 |
| JP | 2017-8351 A | 1/2017 |
| JP | 2017-115232 A | 6/2017 |
| JP | 2017-128806 A | 7/2017 |

OTHER PUBLICATIONS

K. Beneke and G. Lagaly, "Kenyaite—synthesis and properties", American Mineralogist 68, p. 818-826 (Year: 1983).*

* cited by examiner

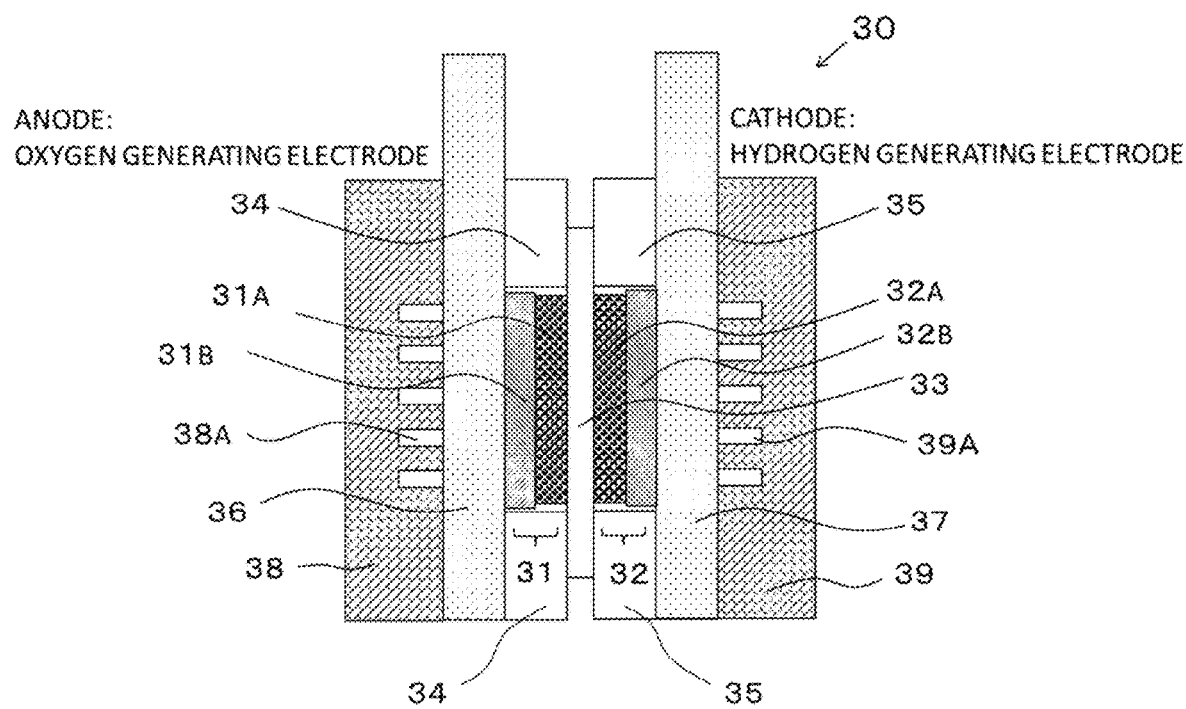

CATALYST LAMINATE, MEMBRANE ELECTRODE ASSEMBLY, ELECTROCHEMICAL CELL, STACK, WATER ELECTROLYZER, AND HYDROGEN UTILIZING SYSTEM

CROSS-REFERENCE TO RELATED APPLICATION

This is a Continuation-in-Part application of U.S. patent application Ser. No. 16/130,401, filed Sep. 13, 2018, the entire contents of which are incorporated herein by reference.

This application is based upon and claims the benefit of priority from Japanese Patent Application No. 2018-54819, filed on Mar. 22, 2018, and No. 2018-174051, filed on Sep. 18, 2018; the entire contents of which are incorporated herein by reference.

FIELD

Embodiments described herein relate to a catalyst laminate, a membrane electrode assembly, an electrochemical cell, a stack, a water electrolyzer, and a hydrogen utilizing system.

BACKGROUND

In recent years, research on electrochemical cells has actively been conducted. For example, polymer electrolyte water electrolysis cells (PEECs) among electrochemical cells are superior in responsiveness to renewable energy of photovoltaic power generation and the like and so are expected to be utilized for generating hydrogen of large-scale energy storage systems.

One big challenge for widespread use of PEEC is the cost reduction by reducing the amount of use of noble metal catalysts. In general, a Pt nanoparticle catalyst is used as a cathode of PEEC and a particulate Ir catalyst is used as an anode in order to ensure sufficient durability and water electrolysis performance. In particular, Ir black or Ir oxide powder was used for the anode and the powder was slurried in a solvent and applied onto a substrate and then, carried on the substrate after the solvent being removed in a drying process or the like. This is not sufficient for close contact between a catalyst layer and the substrate and particularly when the substrate is subject to corrosion or in a high-load environment like operating for a long time in a high current density, catalytic activity is degraded with gradual desorption of catalyst particles, posing a grave problem of durability. Further, Ir fine particles agglomerate so that the specific surface area decreases and also, the substance transportation indispensable for the electrode reaction is hindered, also posing a problem that sufficient water electrolysis efficiency cannot be obtained.

In contrast, according to the catalyst technology of the inventors of the present invention, by sputtering a catalyst onto a substrate by a vacuum film forming method, adhesion strength with the substrate is secured and relatively high durability can be obtained with a small amount of catalyst. Further, with a laminated structure in which a catalyst layer into which vacancies are introduced using a pore-forming material and a void layer containing no catalyst are alternately stacked, the specific surface area contributing to an electrolytic reaction and substance transportation efficiency increase and sufficient electrolysis efficiency is obtained even with a small amount of noble metal.

BRIEF DESCRIPTION OF THE DRAWINGS

FIG. 8 is an explanatory diagram showing a method of producing a catalyst laminate according to the second embodiment and an electrode;

FIG. 9 is a sectional view of an electrochemical cell according to a third embodiment;

DETAILED DESCRIPTION

Figure 1:
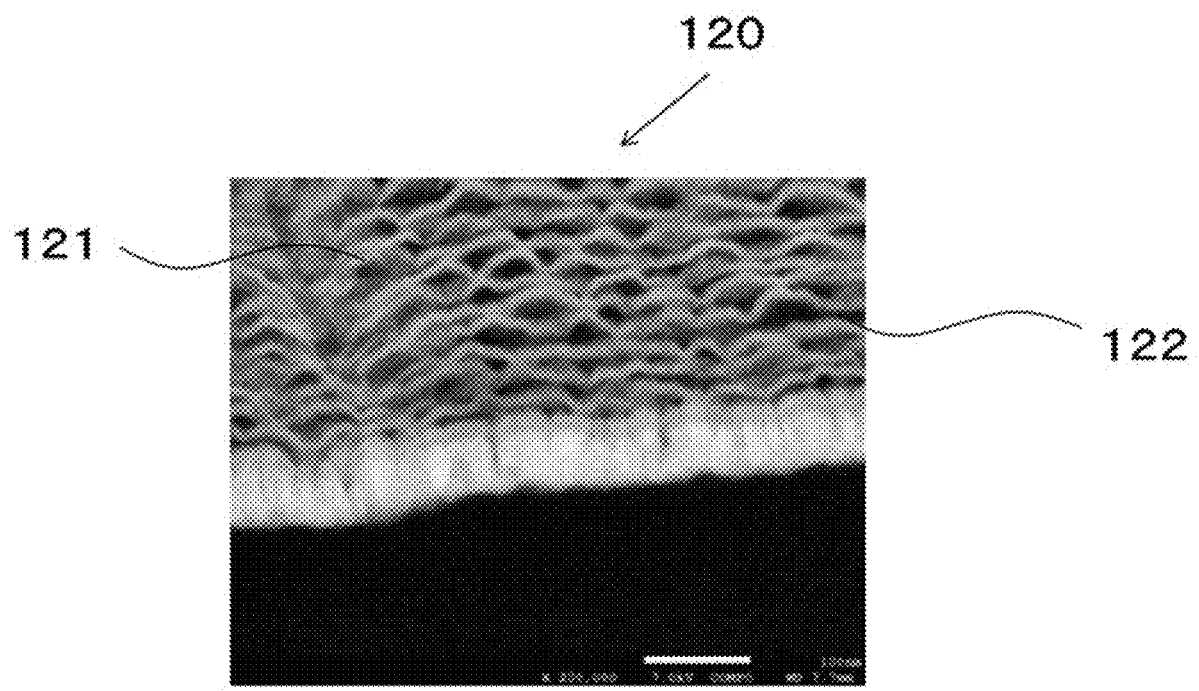
FIG. 1 is an SEM image of a conventional catalyst laminate.

A catalyst laminate includes a plurality of catalyst layers containing at least one of a noble metal and an oxide of the noble metal and at least one of a non-noble metal and an oxide of the non-noble metal, including:

two or more first catalyst layers and two or more second catalyst layers. In an atomic percent of the noble metal obtained by using a line analysis by energy dispersive X-ray spectroscopy in a thickness direction of the catalyst laminate. The first catalyst layer is less than an average of a highest value and a lowest value of the atomic percent of the noble metal. The second catalyst layer has an atomic percent of the noble metal equal to or greater than the average of the highest value and the lowest value thereof. The second catalyst layer is present between the first catalyst layers.

Hereinafter, the embodiments will be described with reference to the drawings. It is to be noted that the same reference numerals are given to common components throughout the embodiments, and redundant explanations are omitted. In addition, each drawing is a schematic diagram to describe each embodiment and to promote an understanding thereof, and its shapes, dimensions, ratios, etc. may be different from those of the actual device, but these can be changed in design as appropriate by considering the following description and known technologies.

First Embodiment

FIG. 1 is an example of an SEM image of a conventional catalyst laminate. A catalyst laminate structure in which two or more layers of a void layer 122 and a catalyst layer 121 are alternately laminated as shown in FIG. 1 has been developed as an electrode having relatively high durability and a high specific surface area. However, with respect to the anode for water electrolysis, the ends of the catalyst layer 121 having a thickness of several nanometers to several tens of nanometers are partially bonded to each other, and substantially all the catalyst layers 121 are constrained to the substrate. Accordingly, the catalyst laminate structure is a stable structure in which the deformation is suppressed with respect to the pressure in the lamination direction so that relatively high durability can be obtained. However, when continuously exposed to high current, high temperature, or high pressure, the load on the structure is large and there is room for improvement of durability while maintaining substance transportation efficiency.

As a result of earnest studies to solve these problems, the inventors invented a catalyst laminate according to the first embodiment.

According to the present embodiment, a catalyst laminate 10 is provided. The catalyst laminate 10 is the catalyst laminate 10 including a plurality of catalyst layers, each containing at least one of a noble metal and a noble metal oxide and at least one of a non-noble metal and a non-noble metal oxide.

The catalyst layer is a layer including a layer (first catalyst layer: A1 layer 11) having a composition fraction of noble metal atoms obtained by measuring the cross section of the catalyst laminate 10 by an energy dispersive X-ray spectroscopy (EDS) line analysis described below less than the average of the highest value and the lowest value of the composition fraction and a layer (second catalyst layer: A2 layer 12) having a composition fraction equal to or more than the average of the highest value and the lowest value of the composition fraction of noble metal atoms.

The catalyst laminate 10 includes two or more first catalyst layers 11 and one or more second catalyst layers 12. The first catalyst layers 11 and the second catalyst layers 12 are alternately arranged. The second catalyst layer 12 is arranged between the first catalyst layers 11. The first catalyst layer 11 and the second catalyst layer 12 are preferably in direct contact with each other.

Figure 2:
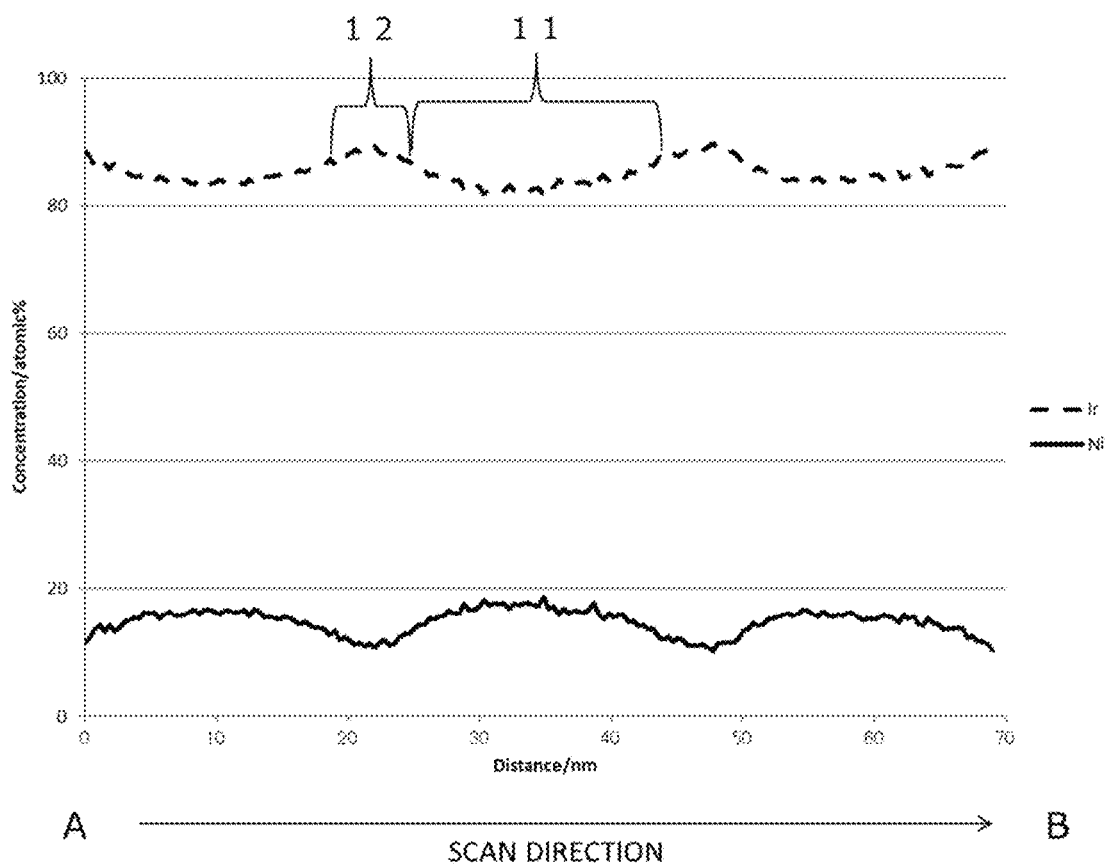
FIG. 2 is an example of an EDS line analysis diagram according to Example 1.

FIG. 2 is a chart (diagram) obtained by EDS line analysis, the horizontal axis represents the distance (nm) in the depth direction, and the vertical axis represents the atomic percent (atom %), which indicates the atomic percents of Ir and Ni when the total of the Ir amount and the Ni amount is taken as 100%. In FIG. 2, the laminate structure has an alternately stacked structure such that the A2 layer 12 is present between the A1 layers 11 and thus, deformation of the catalyst laminate 10 can be prevented, high strength can be secured, and even with a small amount of noble metal, the laminate structure can exist in a stable manner in a high-load environment of high current, high temperature, or high pressure. A partial result that is obtained by analysis until depth of 70 nm is shown in the chart of the FIG. 2. In a deeper region deeper than 70 nm, the A1 layer and the A2 layer are alternately laminated.

Further, both the A1 layer 11 and the A2 layer 12 have a structure with a gap of nm order and the specific surface area can be increased and therefore, substance transportation can be carried out smoothly and catalytic activity can be improved.

The catalyst layer will be described in more detail.

For the catalyst material adopted for a catalyst layer in the present environment, other additives may appropriately be selected in accordance with an electrode reaction. From the viewpoint of catalytic activity and durability, a noble metal or noble metal oxide catalyst is contained and the noble metal element contained in the catalyst layer is at least one element selected from a group including Ir, Pt, Ru, Rh, Os, Pd, and Au. Also, from the viewpoint of forming a stable and rigid laminated structure, a non-noble metal or an oxide thereof is contained and the noble metal element contained in the catalyst layer is at least one element selected from a group including Fe, Co, Ni, Mn, Al, Zn, Ta, W, Hf, Si, Mo, Ti, Zr, Nb, V, Cr, Sn, and Sr.

The shape, atomic ratio, and element distribution of the catalyst layer can be checked by, in addition to a scanning electron microscope (SEM) image and X-ray fluorescence (XRF), elemental mapping by a transmission electron microscope (TEM), a high-angle annular dark field image (HAADF) by TEM, or energy dispersive X-ray spectroscopy (EDS) line analysis.

In the present embodiment, a HAADF image and EDS line analysis method were used, particularly because the thickness of the catalyst layer was thin. The measurement methods thereof will be described.

Figure 3:
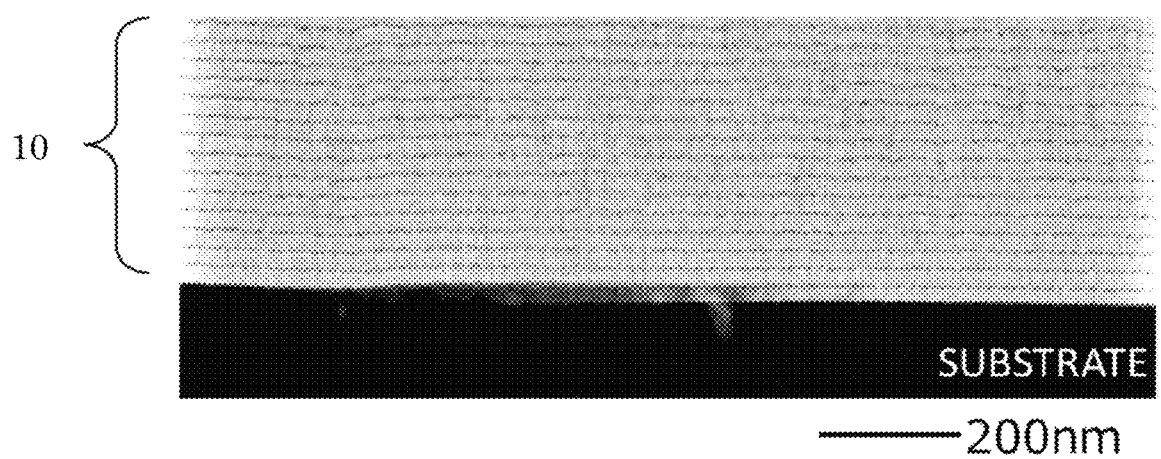
FIG. 3 is a HAADF image according to Example 1.

FIG. 3 is a HAADF image of the catalyst laminate 10 in Example 1. The HAADF image is output based on signal strength of electrons acquired after being scattered at wide angles by an annular detector, the scattering angle θ depends on the atomic number Z, and the output image also has a contrast depending on Z, which is effective for identifying heavy elements.

Figure 4:
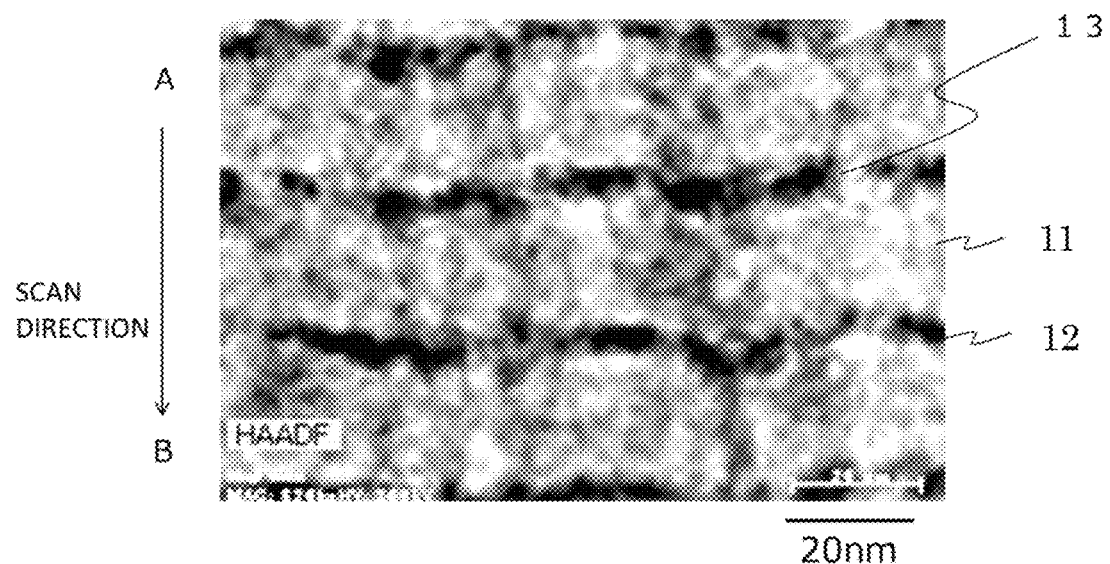
FIG. 4 is a partially enlarged view of FIG. 3.

For observation using a HAADF image, the sample is embedded with a resin and processed to a thickness of 0.1 μm. It is clear from FIG. 3 that the catalyst laminate 10 according to the present embodiment has a structure in which substantially uniform layered catalyst layers are laminated. FIG. 4 is an image obtained by observing a portion of the HAADF image of FIG. 3 described below at a high magnification. In FIG. 4, a plurality of pillars 13 can be observed in the A2 layer 12. The details of the pillar 13 will be described below.

Elemental composition analysis by the EDS line analysis is performed in order to determine the non-noble metal atomic percent (atom %) and noble metal atomic percent (atom %) of the catalyst layer. The measurement method thereof will be described. An acceleration voltage is preferably about 15 kV for the EDS line analysis.

In this measurement, the atomic composition of the noble metal and non-noble metals is measured. First, HAADF images for 20 samples are prepared. For each of the samples thus obtained, EDS line analysis is performed in the depth direction (substrate direction) at intervals of 10 nm in the horizontal direction from the HAADF image along the substrate of the membrane electrode assembly. Based on the results of each line, the highest value and the lowest value of the composition fraction of noble metal atoms are determined, the layer having a composition fraction less than the average thereof is defined as the A1 layer 11, the layer having a composition fraction equal to or more than the average of the highest value and the lowest value of the composition fraction is defined as the A2 layer 12, and the boundary between the A1 layer 11 and the A2 layer 12 is clarified by joining respective border lines. Even when two or more of each of the noble metal and non-noble metal are used to produce a catalyst laminate, the highest value of the atomic percent of noble metals in the EDS line analysis is calculated by using the total value in respective noble metals (for example, the highest value of noble metal A+the highest value of noble metal B). The lowest value of the atomic percent of noble metals is also calculated in the same manner.

From the EDS line analysis, non-novel metal ratio Rm in each layer is determined. Therefore, ratios Rm (A1) and Rm (A2) of (non-noble metal composition ratio)/(noble metal composition ratio) of the A1 layer 11 and the A2 layer 12 are determined respectively from the EDS line analysis. Rm (A1) is preferably between 0.1 and 1.0. This is because as a result of the non-noble metal remaining, promoter action occurs and the activity increases. However, if the ratio of the non-noble metal is too small (Rm (A1) is smaller than 0.1), the effect of the promoter is small and further, it is difficult to maintain a structure having an appropriate void (a portion where no catalyst exists), which is not preferable, and if the ratio of non-noble metal is too large (Rm (A1) is larger than 1.0), the noble metal dissolves in the electrolyte membrane 23 in the membrane electrode assembly 20 to inhibit the proton conductivity of the electrolyte membrane 23, which is not preferable. If Rm (A1) is in the range of 0.2 or more and 0.8 or less, the catalytic activity can be further improved, and reduction in proton conduction can be suppressed, which is more preferable. Also, Rm (A2) is preferably in the range of 0.01 or more and 0.45 or less. If the ratio of non-noble metal is too small (Rm (A2) is less than 0.01), the amount of voids is small and the diffusion of substances such as water and oxygen slows down and if the ratio of non-noble metal is large (Rm (A2) is more than 0.45), the non-noble metal melts away during operation of the electrochemical cell and the A2 layer 12 collapses so that the substance transportation performance decreases. The range of Rm (A2) is more preferably in the range of 0.05 or more and 0.4 or less. When Rm (A2) is 0.05 or more, the catalytic activity is increased by the promoter action of the non-noble metal to improve the overall properties and when Rm (A2) is 0.4 or less, the collapse of the A2 layer 12 can be further suppressed so that the durability of the catalyst laminate 10 can be improved.

The average thickness of the A1 layer 11 is preferably larger than the average thickness of the A2 layer 12 from the viewpoint of stability. From the same viewpoint, it is more preferable that the average thickness of the A1 layer 11 is 1.5 times or more and 2.0 times or less the average thickness of the A2 layer 12. Further, as the A1 layer 11 becomes thicker, the diffusivity of the substance moving inside the A1 layer 11 deteriorates and, on the other hand, if the A1 layer 11 is too thin, the A1 layer 11 is liable to deform and long-term stability cannot be secured, so that the average thickness of the A1 layer 11 is preferably 4 nm or more 35 nm or less.

As the A2 layer 12 becomes thicker, the diffusivity of the substance moving inside the A2 layer 12 becomes better and, on the other hand, if the A2 layer 12 is too thick, the A2 layer 12 collapses during electrochemical cell operation or hot pressing, resulting in poor stability, and therefore, the average thickness of the A2 layer 12 is preferably 2 nm or more and 34 nm or less. It is more preferable that the average thickness of the A1 layer 11 be in the range of 10 nm or more and 25 nm or less and the average thickness of the A2 layer 12 be in the range of 5 nm or more and 20 nm or less because the stability and diffusibility of the catalyst laminate 10 can be further improved.

The average thickness of each layer of the A1 layer 11 and the A2 layer 12 can be determined by the EDS line analysis. The average thickness of the A1 layer is an average value of thicknesses of each of the A1 layer 11 calculated from the boundaries obtained from the EDS line analysis. The average thickness of the A2 layer is an average value of thicknesses of each of the A2 layer 12 calculated from the boundaries obtained from the EDS line analysis.

In order to promote the substance transportation of the catalyst laminate 10 to the substrate side, it is effective to reduce the thickness of the catalyst laminate 10 as a whole. With the substance transportation being promoted, a catalyst on the substrate side can be used and the activity of the catalyst laminate 10 as a whole can be improved. Therefore, for example, when the thickness of the A2 layer 12 is constant and the amount of the noble metal in the catalyst laminate 10 as a whole is constant, by making thicker each layer of the A1 layer 11, which has a large amount of the noble metal to be a catalyst, the moving distance of the substance diffused to the substrate through the catalyst laminate 10 can be made shorter so that the activity of the catalyst laminate 10 as a whole can be improved. However, as described above, an increase in the thickness per layer of the A1 layer 11 is undesirable because the substance diffusibility is suppressed.

Therefore, in the present embodiment, the A1 layer 11 can be made thick enough to improve the activity and substance diffusibility of the catalyst laminate 10 and the A2 layer 12 can be made to have the minimum thickness that does not inhibit substance transportation and therefore, the overall thickness of the catalyst laminate 10 can be reduced while improving the overall activity of the catalyst laminate 10.

The manufacturing method for the catalyst laminate 10 will be described later, but if briefly explained, the laminated structure is manufactured by laminating mixture layers of novel metal and non-novel metal by multi-target sputtering, then washing off some amount of the non-novel metal by etching. The structure before etching is proportional to the output ratio and the sputtering time at the time of sputtering. The non-novel metal is eluted by etching, then the A1 layer 11 and the A2 layer 12 are crushed, and then these layers tend to be diminished. If non-novel metal ratio is high, the non-novel metal ratio Rm both of the A1 layer 11 and A2 layer 12 becomes high. If non-novel metal ratio is too high in each layer before etching, the non-novel metal ratio doesn't become too high, and then the non-novel metal ratio doesn't become above a certain ratio because non-novel metal is easily melted by etching. However, if plenty non-novel metal exists in the A1 layer 11 and A1 layer 12, the non-novel metal ratio Rm of the A1 layer 11 and the A2 layer tends to be higher if a solution concentration used for etching is low and etching time is short. The non-novel metal ratio Rm tends to be lower if the solution concentration is high and/or etching time is long. In order to implement a structure for increasing the amount of catalyst contained in the catalyst laminate 10 while suppressing the overall thickness of the catalyst laminate 10, it is preferable that the A1 layer 11 and the A2 layer 12 be in the above thickness ranges and Rm (A1)>Rm (A2) apply. By setting Rm (A1)>Rm (A2), sudden deformation can be suppressed, which can contribute to improvement in durability.

Next, a method of measuring the presence of the catalyst present in the A1 layer 11 and the A2 layer 12 will be described.

First, an image is captured using TEM. In imaging, 20 locations within 10% from the intersection of a long side and a short side of the substrate of the membrane electrode composite are observed. In the observation unit, the magnification is appropriately set so that the field of view becomes 200 nm×200 nm in TEM imaging.

Figure 5:
FIG. 5 is a binarized image of FIG. 4.

In the TEM image thus obtained, in order to verify the presence of the catalyst present in the A1 layer 11 and the A2 layer 12, it is effective to obtain the black and white contrast ratio. By obtaining the black and white contrast ratio in the TEM image, as shown in FIG. 5, a region close to white indicates the presence of a catalyst and a portion where no catalyst is present is shown in black. An analysis using a TEM image described below is carried out to clarify its structural features. The apparatus and analysis conditions used for TEM observation and the software used for image analysis are as follows:

[TEM Measurement Conditions]
InstructName=TalosF200X (manufactured by FEI)
AcceleratingVoltage=200,000 V
Magnification=320,000

[Software for TEM Image Analysis]
PhotoImpact (product of COREL Corporation)
Image-Pro plus (manufactured by Media Cybernetics, Inc.)

Hereinafter, an image analysis method will be described. First, a TEM image of the cross section of the catalyst laminate 10 was obtained by TEM observation. By using the image editing software PhotoImpact, the TEM image was made to display black in a portion where no catalyst is present and white in a catalyst portion based on monochrome binary (resolution: current image, shape: none). The image obtained in this way was subjected to an automatic measurement function (the ratio of the black portion and the white portion was measured) using the image analysis software Image-Pro Plus in the range of the A1 layer 11 and the A2 layer 12 of the TEM image. Accordingly, the ratio (region A÷(region A+region B)×100) of the portion where no catalyst is present (region A) and the portion where a catalyst is present (region B) is determined.

Figure 6:
FIG. 6 is a schematic diagram of catalyst amount measurements in a catalyst layer.

At this point, the range of each of the A1 layer 11 and the A2 layer 12 is, as shown in FIG. 6, the thickness of each layer determined by the EDS line analysis and a straight line orthogonal to the thickness and is a range indicated by "Enclosed" in the width of the TEM image.

The portion of the A1 layer 11 where no catalyst is present in the TEM image is preferably 30% or more and less than 90% in area ratio. This is because, if the ratio is 30% or more, the diffusion resistance of substance moving in the A1 layer 11 can be suppressed and, if the ratio is less than 90%, the structural durability of the A1 layer 11 can be maintained. A more preferable range is 50% or more and less than 80%. Within this range, it is possible to combine suppression of the diffusion resistance of substance moving in the A1 layer 11 with the structural durability more effectively.

In the A2 layer 12, the portion where no catalyst is present is preferably 30% or more and 95% or less in area ratio. If such a portion is less than 30%, the portion where no catalyst is present is small, so that the substance transportation of water required for a reaction and the generated oxygen is delayed, causing an increase in the overvoltage. On the other hand, if the portion where no catalyst is present is larger than 95%, the structure is brittle, the structure collapses in a long-term operation, and the diffusion of substance slows down, causing an increase in the overvoltage. In the A2 layer 12, it is more preferable that the portion where no catalyst is present be 35% or more and 70% or less. Within this range, it is possible to suppress an increase in the overvoltage caused by delay in substance transportation more efficiently.

As shown in FIG. 5, a catalyst may be present in the A2 layer 12 so as to connect the A1 layers 11 to each other. Such a catalyst portion is called a pillar 13. Due to the presence of the pillar 13, the pillar 13 plays a role like a pillar in the A2 layer 12 in a long-term operation, whereby the thickness of the A2 layer 12 can be maintained and the A1 layers 11 can be connected to each other so that peeling of the A1 layers 11 can be prevented.

In the catalyst laminate 10 provided in the present embodiment, the A1 layer 11 controls the composition of noble metal atoms and maintains the optimum thickness and, on the other hand, the A2 layer 12 is thinned to the minimum thickness where reactions and products can diffuse and further, has a structure in which the composition ratio of noble metal atoms and non-noble metal atoms is controlled so that even with a small amount of noble metal, a laminated structure ensuring strength and substance transportation efficiency can be implemented.

Second Embodiment

Figure 7:
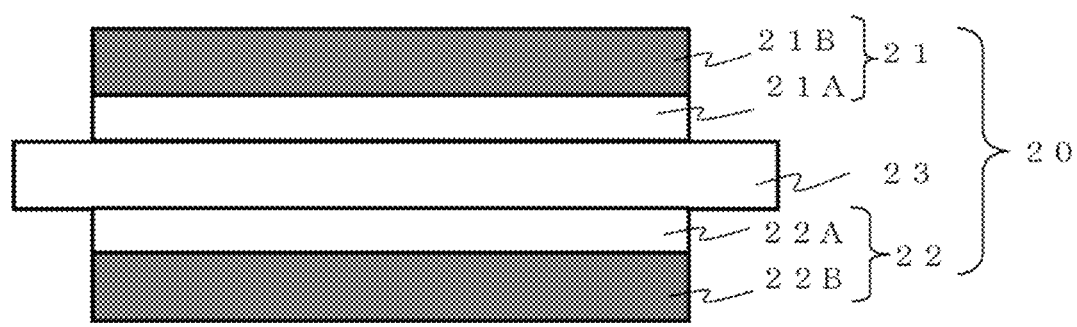
FIG. 7 is a sectional view of a membrane electrode assembly (MEA) according to a second embodiment.

In a second embodiment, as shown in FIG. 7, a membrane electrode assembly (MEA) 20 including the catalyst laminate 10 according to the first embodiment is provided. The MEA 20 is constructed of a first electrode 21, a second electrode 22, and the electrolyte membrane 23 arranged therebetween.

The first electrode 21 adjacent to the electrolyte membrane 23 has a first gas diffusion layer (substrate) 21B and a first catalyst laminate 21A stacked in this order from above in the drawing. The second electrode 22 has a second gas diffusion layer (substrate) 22B and a second catalyst laminate 22A stacked in this order from below in the drawing. The catalyst laminate 10 is arranged on the substrate.

First, the substrate and the electrolyte membrane constituting the MEA 20 will be described in order.

<Substrate>

The porosity and conductivity are required of the substrate of an electrode. When used as an anode of water electrolysis cells, a titanium material is generally adopted to ensure durability. The form of a substrate is not specifically limited and a titanium mesh, cloth made of titanium fiber, titanium nonwoven cloth, and a titanium sintered body can be cited. Water electrolysis performance may be improved by adjusting the aperture ratio, particularly the structure of a portion in contact with the catalyst laminate 10 of a porous substrate or surface treatment of the substrate such as blasting. This can be considered because the water supply to the catalyst laminate 10 and the discharge of electrode reaction products become smooth, promoting an electrode reaction in the catalyst laminate 10. Another coating layer may also be provided on the substrate. Durability of an electrode may significantly be improved by a conductive closely-packed coating layer. The coating layer is not particularly limited and metallic materials, oxide, ceramic materials such as nitride, carbon, and the like can be used.

<Electrolyte Membrane>

Ionic conductivity is frequently required of an electrolyte membrane. As an electrolyte membrane having proton conductivity, for example, a fluororesin having a sulfonic group (for example, Nafion (manufactured by Du Pont K.K.), Flemion (manufactured by Asahi Kasei Corporation), and Asibulec (manufactured by Asahi Glass Co., Ltd.), a hydrocarbon membrane, or an inorganic substance such as tungstic acid and phosphotungstic acid can be used.

The thickness of the electrolye membrane can appropriately be determined in consideration of characteristics of MEA. From the viewpoint of strength, solubility resistance, and output characteristics of MEA, the thickness of the electrolyte membrane when dried is preferably 10 μm or more and 200 μm or less.

Hereinafter, the manufacturing method of an electrode having the catalyst laminate 10 according to the present embodiment and the configuration and the manufacturing method of MEA will be described using FIG. 8.

As for an anode, a material containing a catalyst material and a pore-forming agent material are formed on the Ti substrate 21B using a vacuum device to produce a precursor of the catalyst laminate 10. For the production of an Ir oxide based catalyst laminate 10, particularly a reactive sputtering method that adds an oxygen gas to a chamber using a sputtering device is appropriate. In this case, durability of an electrode and characteristics of an electrochemical cell can significantly be improved by optimizing parameters such as power supply power during sputtering and the temperature of the substrate (Step 1).

Subsequently, a portion of non-noble metals is removed from the precursor of the catalyst laminate 10 by selective etching using a chemical such as acid or alkali to obtain an electrode (Step 2).

Basically, the precursor of the catalyst laminate 10 is sequentially formed on the substrate by simultaneous sputtering or vapor deposition of the catalyst material containing a noble metal as the main component and a pore-forming agent material made of a non-noble metal. In the precursor formation, the composition ratio of the noble metal and non-noble metals in each layer of the catalyst laminate 10 before etching, the number of layers, and the thickness of layers can be controlled by adjusting the power supply power and gas pressure at the time of forming the precursor and the formation ratio of the catalyst material and the pore-forming material. Specifically, the thickness of the A1 layer 11 and the A2 layer 12 decreases with decreasing output of the noble metal and the thickness of the A1 layer 11 and the A2 layer 12 can be increased with increasing output of the noble metal. Further, even in the etching process of a pore-forming material using a chemical such as acid or alkali, the thickness and shape of the catalyst layer, the composition ratio in the catalyst layer, and the structure of the catalyst laminate 10 can be adjusted.

Further, after removal of the pore-forming material, the structure of the catalyst laminate 10 can also be adjusted by carrying out post-treatment such as heat treatment as necessary and catalytic activity and durability can be improved by arbitrarily adjusting the laminate structure (Step 3).

For example, Rm (A1) and Rm (A2) can be controlled by washing with an acid aqueous solution such as nitric acid, hydrochloric acid, sulfuric acid, etc. or an alkaline aqueous solution such as sodium hydroxide, potassium hydroxide, ammonia etc. using the time, concentration, and temperature as parameters.

Though the crystal structure of the catalyst layer after sputtering may be amorphous in some cases, the crystal structure can be oriented by heat treatment so that the catalytic activity and durability can be further improved.

While the method of producing an oxide-based catalyst laminate 10 has been described so far, when the catalyst laminate 10 containing no oxide is produced, the catalyst laminate 10 is produced by the same method except that oxygen is not used in the environment for sputtering.

In addition, the catalyst laminate 10 having a different composition for each layer like one layer of the catalyst laminate 10 containing a noble metal, a noble metal oxide, and a non-noble metal and other layers containing only a noble metal and a non-noble metal can be similarly produced by changing the sputtering environment.

Depending on the substrate, the catalyst laminate 10 is often directly formed, but it is possible to form a dense interfacial layer between the catalyst laminate 10 and the substrate by a direct forming process and as a substrate protective layer, the deterioration of the substrate can be significantly suppressed.

The MEA 20 according to the present embodiment is produced by using the catalyst laminate 10 described above as at least one of the first and second catalyst laminates 21A and 22A in FIG. 7 and combining with the electrolyte membrane 23.

In general, the MEA 20 is produced by joining the catalyst laminate 10 and the electrolyte membrane 23 through heating/pressurization. When the forming substrate of the catalyst laminate 10 is a gas diffusion layer, both electrodes of the MEA 20 are stacked as shown in FIG. 7 by sandwiching the electrolyte membrane 23 between electrodes containing the catalyst laminate 21A and the catalyst laminate 22A and joined to obtain the MEA 20. When the forming substrate of the catalyst laminate 10 is a transfer substrate, the MEA 20 can be produced by transferring the catalyst laminate 10 from the transfer substrate to the electrolyte membrane 23 by heating/pressurization and then, arranging a gas diffusion layer on the catalyst laminate 10 and joining with the counter electrode.

Each member as described above is commonly joined by using a hot pressing machine. The pressing temperature is a temperature higher than the glass transition temperature of a polymer electrolyte used as a binder of the first electrode 21, the second electrode 22, and the electrolyte membrane 23 and generally, 100° C. or higher and 300° C. or lower. The pressing pressure and the pressing time depend on the hardness of the first electrode 21 and the second electrode 22 and generally, the pressure is 5 kg/cm$^2$ or more and 200 kg/cm$^2$ or less and the time is between 5 sec and 20 min.

A process as described below may also be adopted to join the catalyst laminate 10 and the electrolyte membrane 23. The electrolyte membrane 23 is formed on the substrate with the catalyst laminate 10 and the catalyst laminate 10 of the counter electrode is attached thereonto. If the substrate is a gas diffusion layer, the membrane electrode assembly can directly be used as the MEA 20. If the substrate is a transfer substrate, the membrane electrode assembly is used as the MEA 20 after the gas diffusion layer is replaced.

By including the catalyst laminate according to the first embodiment, the MEA provided by the present embodiment ensures strength and substance transportation efficiency and can provide sufficient durability and water electrolysis performance even with a small amount of noble metal.

Third Embodiment

According to a third embodiment, an electrochemical cell including the MEA according to the second embodiment is provided.

FIG. 9 shows the configuration of an electrochemical cell 300 according to the present embodiment. The MEA has a configuration in which a catalyst laminate 31A is formed on a substrate 31B as a first electrode 31, a catalyst laminate 32A is formed on a substrate 32B as a second electrode 32, and an electrolyte membrane 33 is sandwiched therebetween. An electrochemical cell 30 is produced on the both sides of the MEA by mounting current collector plates 36 and 37 and clamping plates 38 and 39 via gaskets 34 and 35 and clamping the MEA at appropriate pressure.

By including the MEA according to the second embodiment, the electrochemical cell according to the present embodiment can provide sufficient durability and water electrolysis performance even with a small amount of noble metal.

Fourth Embodiment

According to the present embodiment, a stack is provided. The stack according to the present embodiment includes the electrochemical cell according to the third embodiment.

Figure 10:
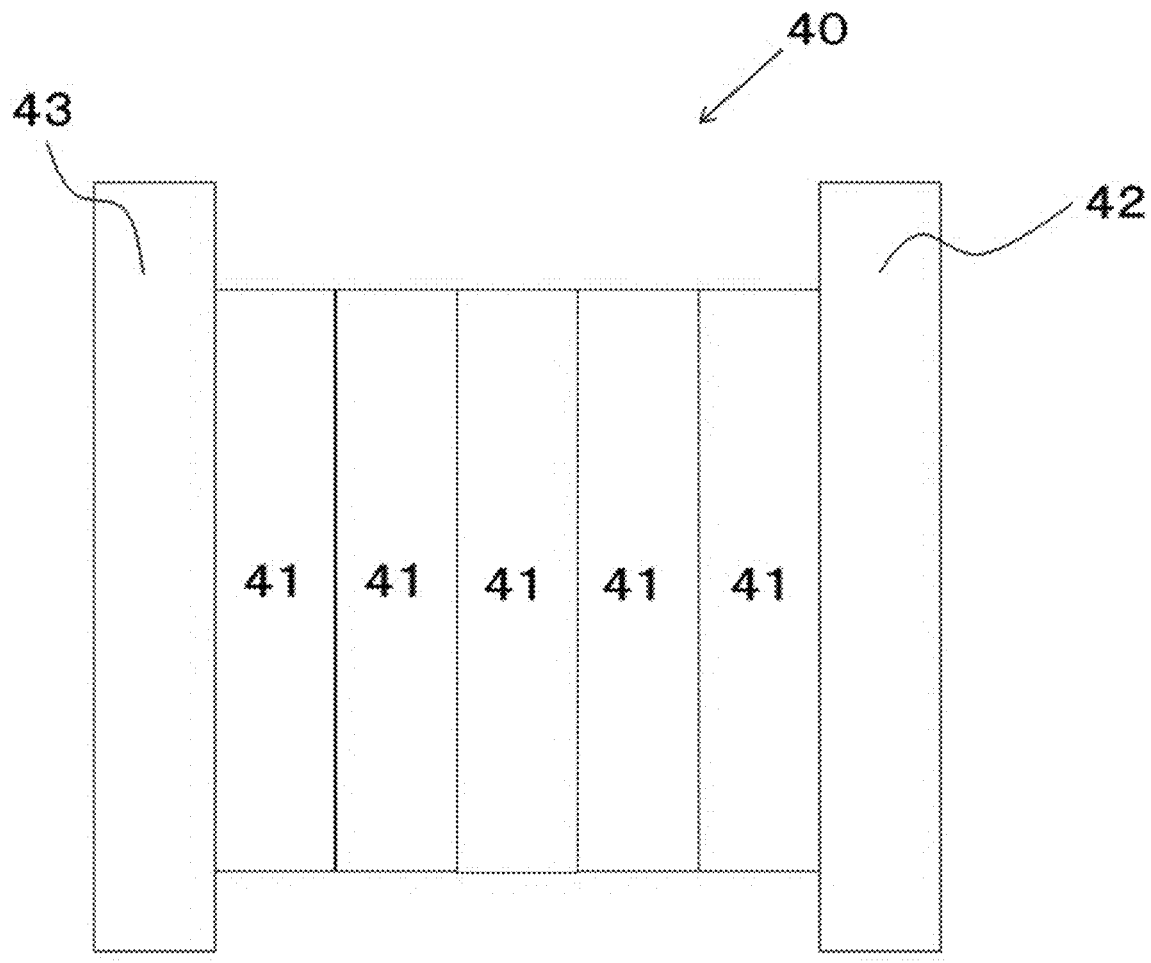
FIG. 10 is a sectional view of a stack according to a fourth embodiment.

FIG. 10 shows the configuration of a stack 400 according to the present embodiment. A stack 400 has a configuration in which a plurality of electrochemical cells 41 is connected in series. A stack is produced by mounting clamping plates 42 on both ends of an electrochemical cell and clamping the electrochemical cell at appropriate pressure.

By including the electrochemical cell according to the third embodiment, the stack according to the present embodiment can provide sufficient durability and water electrolysis performance even with a small noble metal amount. The electrochemical cell having only single MEA 200 can generate small amount of hydrogen. However, the stack 400 can generate large amount of hydrogen that is constituted by plurality of the electrochemical cell 300 is connected in series.

Fifth Embodiment

Figure 11:
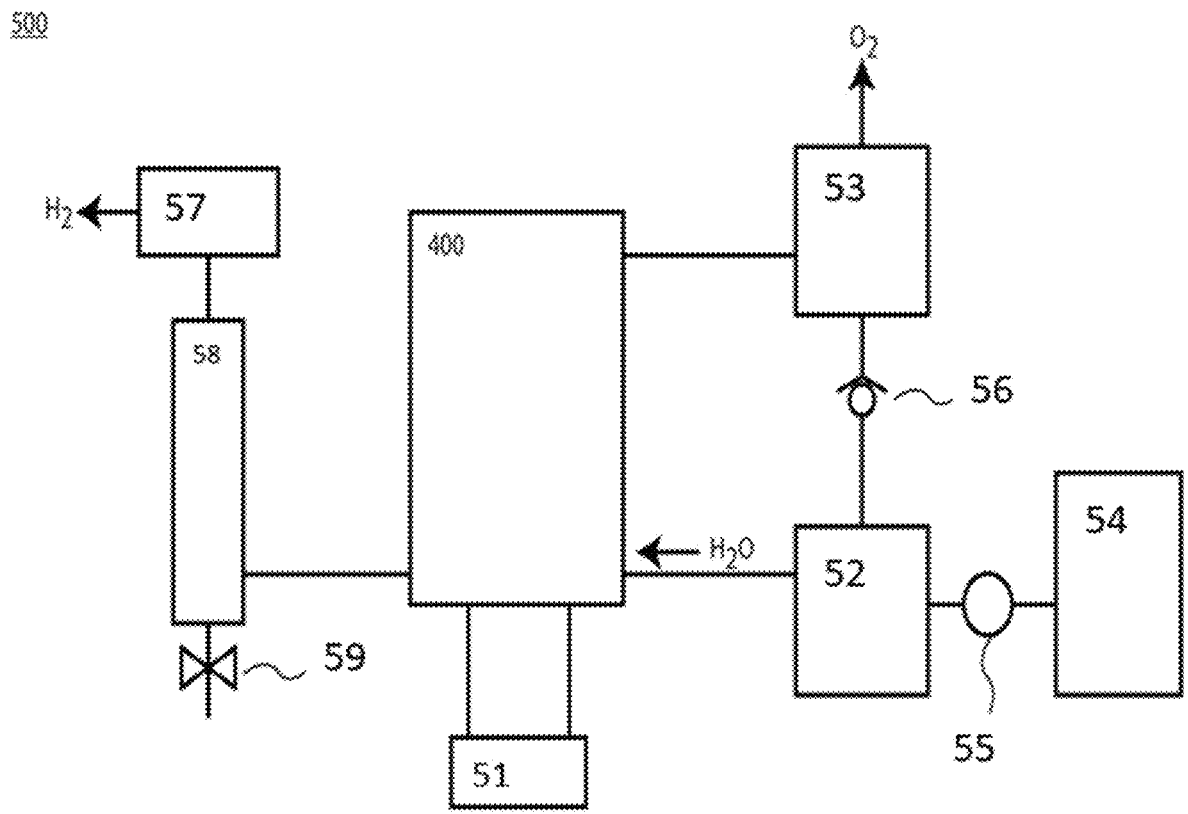
FIG. 11 is a diagram showing a water electrolyzer according to a fifth embodiment.

FIG. 11 is a diagram showing a water electrolyzer according to a fifth embodiment.

In the fifth embodiment, the stack 400 is used for a water electrolyzer 500. As shown in FIG. 9, water electrolysis cells stacked in series are used as the stack 400 for water electrolysis. A power supply 51 is attached to the stack 400 for water electrolysis, and a voltage is applied between the anode and the cathode. A gas-liquid separator 52 for separating generated gas and unreacted water and a mixing tank 53 are connected to the anode side of the stack 400 for water electrolysis and water is sent to the mixing tank 53 by a pump 55 from an ion exchanged water producing apparatus 54 that supplies water for mixing in the mixing tank 53 through a check valve 56 from the gas-liquid separator 52 before being circulated to the anode. Oxygen generated in the anode passes through the gas-liquid separator 52 so that an oxygen gas is obtained. On the other hand, a hydrogen purification device 58 is connected to the cathode side subsequent to a gas-liquid separator 57 to obtain high purity hydrogen. Impurities are discharged via a path having a valve 59 connected to the hydrogen purification device 58. In order to control the operating temperature in a stable manner, it is possible to control the heating of the stack and a mixing tank, the current density during thermal decomposition, and the like. In addition to the stack 400, the water electrolyzer 500 can use the MEA 200 or the electrochemical cell 300.

By including the stack according to the fourth embodiment, the water electrolyzer according to the present embodiment can provide sufficient durability and water electrolysis performance even with a small amount of noble metal.

Sixth Embodiment

Figure 12:
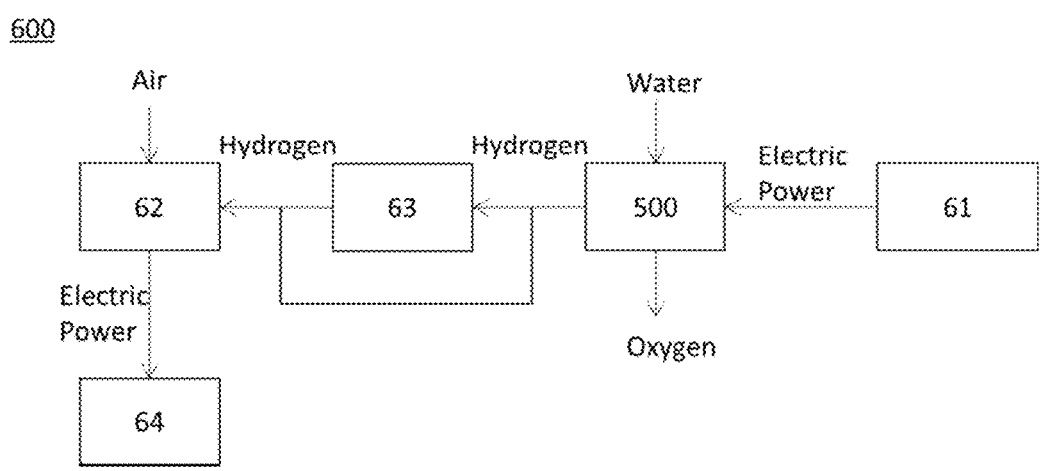
FIG. 12 is a diagram showing a hydrogen utilizing system according to a sixth embodiment.

FIG. 12 is a diagram showing a hydrogen utilizing system 600 according to a sixth embodiment.

The water electrolyzer 500 is used in the sixth embodiment. As shown in FIG. 12, electric power generated from power generator 61 such as solar power or wind power is transformed to hydrogen gas in the water electrolyzer 500. Additionally, hydrogen gas is directly supplied to a hydrogen generator 62 or is supplied to a hydrogen generator 62 via a hydrogen gas tank 63. Hydrogen gas is transformed to electrical power by reacting with air in the hydrogen generator 62, electrical power can be used in a drive unit 64 as electric power. For example, hydrogen gas turbine, fuel cell and the like can be used as the hydrogen generator 62. For example, car, home appliances, industrial equipment and the like can be used as the drive unit 64. By using the electrode according to this invention, the hydrogen utilizing system of sixth embodiment with low power and high durability can be built.

Seventh Embodiment

Figure 13:
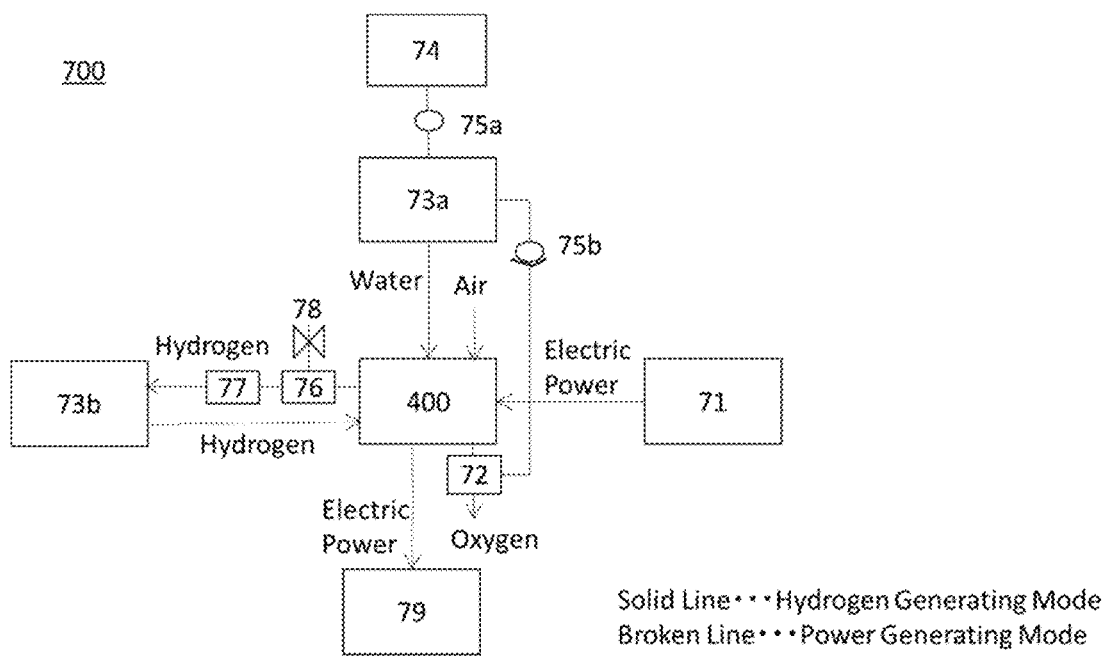
FIG. 13 is a diagram showing a hydrogen utilizing system according to a seventh embodiment.

FIG. 13 is a diagram showing a hydrogen utilizing system 700 according to a seventh embodiment.

In the seventh embodiment, a utilized regenerative fuel cell (URFC) that switches hydrogen production by water electrolysis and power generation is equipped. The water electrolysis stack 400 can be used as the utilized regenerative fuel cell. As shown in FIG. 13, water electrolysis cells 300 stacked in series are used as the water electrolysis stack 400. A power generator 71 such as solar power generator, wind power generator, and the like is attached to the water electrolysis stack 400. Voltage is applied between anode and cathode in a hydrogen generating mode. At the anode part, the water electrolysis stack 400 is connected to a gas-liquid separator 72 and a mixing tank 73a that separate generated gas and non-reacted water. Water is sent to mixing tank 73a from an ion exchanged water producing apparatus 74 that sent water using a pump 75a. And water passes a check bulb 75b from the gas-liquid separator 72, water is mixed in the mixing tank 73a, and water is circulated into the anode. Oxygen generated at anode passes the gas-liquid separator 72, and oxygen gas is obtained. At the cathode side, the water electrolysis stack 400 is connected to a gas-liquid separator 76 with a hydrogen purification device and generates high purity hydrogen gas. The high purity hydrogen gas is stocked in a hydrogen gas tank 73b. Impurity material is discharged via a line including a bulb 78 connected to a gas-liquid separator 76.

The high purity hydrogen gas stocked in the hydrogen gas tank 73b is supplied to the water electrolysis stack 400 and reacts with outside air in a power generating mode. The high purity hydrogen gas is transformed in to electric power with such fuel cell reaction, electric power can be used for a drive unit 79. For example, car, home appliances, industrial equipment and the like can be used as the drive unit 79. By using the electrode according to this invention, the hydrogen utilizing system of seventh embodiment being compact size with low power and high durability can be built.

EXAMPLES

Hereinafter, Examples and Comparative Examples will be described.

Example 1

<Electrode Production>
(PEEC Standard Cathode Electrode)

Carbon paper Toray060 (manufactured by Toray Industries, Inc.) having a carbon layer of the thickness of 25 μm was prepared as a substrate. A catalyst layer having a laminated structure containing a void layer was formed by the sputtering method such that the loading density of a Pt catalyst became 0.1 mg/cm$^2$ to obtain an electrode having a porous catalyst layer. The electrode was used as the standard cathode of Examples and Comparative Examples.

(Preparation of PEEC Anode)

A titanium mesh substrate was prepared as a substrate. On this substrate, a laminate of a catalyst precursor including a noble metal and a non-noble metal or a mixture of oxides thereof was obtained by a reactive sputtering method. Upon the formation, in order to obtain desired values of the composition ratio of the noble metal and the non-noble metal in each layer of the precursor, the composition ratio of oxygen atoms and metal atoms, the number of layers, and the layer thickness, the output ratio (W) and the sputtering time (S) for simultaneous sputtering of the noble metal and the non-noble metal were adjusted as shown in Table 1.

More specifically, sputtering is performed for 180 seconds with the RF output of the noble metal Ir set to 100 W in oxygen-argon and the DC output of Ni of the non-noble metal set to 750 W. Subsequently, sputtering is performed for 180 seconds with the RF output of Ir set to 25 W and the DC output of Ni set to 50 W. Further, sputtering is performed for 180 seconds with the RF output of the noble metal Ir set to 100 W and the DC output of Ni of the non-noble metal set to 750 W. Subsequently, sputtering is performed for 180 seconds with the RF output of Ir set to 25 W and the DC output of Ni set to 50 W. The above steps are repeated until desired Ir amount is obtained.

After sputtering, a portion of Ni is removed by etching, and adjusting etching (acid treatment) time to obtain desired values. a laminate of an A1 layer and a A2 layer of a catalyst aggregate as a mixture of Ir and Ni is prepared, and then heat treatment is carried out to obtain an electrode made of a catalyst laminate. The amounts of noble metal catalyst are all 0.1 mg/cm$^2$.

A necessary size was appropriately cut out from each electrode, and the thickness of each membrane and the atomic percent in the catalyst laminate were determined by the EDS line analysis. The measurement method is as described in the first embodiment.

The analysis results of the produced electrodes are shown in Table 2. Further, the pillar was verified from a cross-sectional HAADF image of Example 1.

<Production of PEEC MEA>

A square slice of 5 cm×5 cm was cut out from the above PEEC standard cathode and each anode. A standard cathode, an electrolyte membrane (Nafion 115 (manufactured by Du Pont)), and an anode were each combined, thermocompression bonded, and joined to obtain various kinds of PEEC MEA.

<Production of PEEC Single Cell>

The obtained MEA was set between two separators provided with a flow path to produce a PEEC single cell (electrochemical cell).

<Catalyst Evaluation>

The evaluation of the catalyst was carried out by creating MEA and incorporating the MEA into an electrochemical cell for evaluation, setting the cell temperature to 80° C., continuously operating at 2 A/cm$^2$ while supplying water to the anode, and measuring the initial cell voltage after 50 h to use the voltage as an index of performance.

The evaluation criteria at this point are set as: less than 1.9 V . . . A, 1.9 to 2 V . . . B, and greater than 2 V . . . C.

The cell voltage was measured while continuously operating at 5 A/cm$^2$, and the operation time when the cell voltage increased to 110% of the initial voltage was defined as the endurance time. Evaluation criteria at this point are set as: endurance time less than 200 hours . . . C, 200-2000 hours . . . B, and greater than 2000 hours . . . A. The results are shown in Table 2.

Examples 2 to 11

In the same manner as in Example 1, a catalyst laminate was produced by reactive sputtering. The conditions therefor are as shown in Table 1. The results are as shown in Table 2.

Comparative Examples 1 to 11

In the same manner as in Example 1, a catalyst laminate was produced by reactive sputtering. The conditions therefor are as shown in Table 1. The results are as shown in Table 2.

TABLE 1

| | Sputtering Conditions [W] | | | | | | | | Acid Treatment |
|---|---|---|---|---|---|---|---|---|---|
| | A1 Layer | | | | A2 Layer | | | | |
| | Ir/W | Ir/s | Ni/W | Ni/s | Ir/W | Ir/s | Ni/W | Ni/s | Time [Hour] |
| Example | | | | | | | | | |
| 1 | 100 | 180 | 750 | 180 | 25 | 180 | 50 | 180 | 1 |
| 2 | 50 | 360 | 190 | 360 | 220 | 20 | 45 | 20 | 1 |
| 3 | 25 | 720 | 940 | 720 | 50 | 90 | 700 | 90 | 1 |
| 4 | 25 | 1080 | 620 | 1080 | 50 | 90 | 700 | 90 | 1 |
| 5 | 20 | 270 | 2500 | 270 | 60 | 90 | 840 | 90 | 1 |
| 6 | 20 | 180 | 3500 | 180 | 20 | 90 | 280 | 90 | 1 |
| 7 | 30 | 1050 | 650 | 1050 | 29 | 1050 | 400 | 1050 | 1 |
| 8 | 30 | 1050 | 650 | 1050 | 150 | 120 | 2100 | 120 | 1 |
| 9 | 50 | 630 | 110 | 630 | 150 | 120 | 100 | 120 | 1 |
| 10 | 150 | 120 | 1700 | 120 | 30 | 150 | 120 | 150 | 1 |
| 11 | 100 | 180 | 750 | 180 | 45 | 100 | 160 | 100 | 1 |
| Comparative Example | | | | | | | | | |
| 1 | 100 | 180 | 750 | 180 | 50 | 90 | 40 | 90 | 0.2 |
| 2 | 100 | 180 | 750 | 180 | 50 | 90 | 200 | 90 | 10 |
| 3 | 100 | 180 | 750 | 180 | 50 | 90 | 150 | 90 | 0.5 |
| 4 | 100 | 180 | 750 | 180 | 50 | 90 | 20 | 90 | 0.5 |
| 5 | 200 | 180 | 1500 | 180 | 100 | 180 | 200 | 180 | 0.5 |
| 6 | 30 | 90 | 150 | 90 | 100 | 180 | 120 | 180 | 0.3 |
| 7 | 100 | 180 | 750 | 180 | 100 | 13.5 | 160 | 13.5 | 0.5 |
| 8 | 100 | 180 | 750 | 180 | 100 | 315 | 160 | 315 | 0.5 |
| 9 | 100 | 180 | 750 | 180 | 100 | 270 | 160 | 270 | 0.5 |
| 10 | 30 | 90 | 150 | 90 | 100 | 36 | 120 | 36 | 0.3 |
| 11 | 100 | 180 | 220 | 180 | 50 | 90 | 150 | 90 | 0.8 |

TABLE 2

| | Rm(A1) | Rm(A2) | Ave. Thickness A1 (nm) | Ave. Thickness A2 (nm) | Voltage | Endurance Time |
|---|---|---|---|---|---|---|
| Example | | | | | | |
| 1 | 0.20 | 0.10 | 20 | 5 | A | A |
| 2 | 0.10 | 0.01 | 29 | 5 | B | B |
| 3 | 0.98 | 0.39 | 19 | 5 | B | A |
| 4 | 1.00 | 0.39 | 30 | 5 | B | A |
| 5 | 0.99 | 0.40 | 6 | 6 | B | A |
| 6 | 0.95 | 0.38 | 4 | 2 | B | A |
| 7 | 0.99 | 0.40 | 35 | 34 | B | A |
| 8 | 1.00 | 0.39 | 34 | 20 | B | A |
| 9 | 0.10 | 0.02 | 35 | 19 | B | B |
| 10 | 0.30 | 0.21 | 20 | 5 | A | A |
| 11 | 0.20 | 0.18 | 19 | 5 | A | A |
| Comparative Example | | | | | | |
| 1 | 1.23 | 0.39 | 20 | 5 | C | A |
| 2 | 0.05 | 0.01 | 19 | 5 | C | A |
| 3 | 1.00 | 0.50 | 20 | 5 | B | C |
| 4 | 0.99 | 0.005 | 20 | 5 | B | C |
| 5 | 0.98 | 0.40 | 40 | 21 | C | A |
| 6 | 0.97 | 0.39 | 3 | 20 | B | C |
| 7 | 0.99 | 0.40 | 20 | 1.5 | C | C |
| 8 | 1.00 | 0.39 | 22 | 35 | A | C |
| 9 | 0.97 | 0.40 | 20 | 30 | C | A |
| 10 | 0.95 | 0.48 | 3 | 4 | A | C |
| 11 | 0.30 | 0.40 | 20 | 5 | C | C |

Rm (A1): Non-noble metal/noble metal atom ratio of A1
Rm (A2): Non-noble metal/noble metal atom ratio of A2

As can be seen from Table 2, the single cell into which the MEAs of Examples 1 to 11 are incorporated has a lower electrolytic voltage (V) and higher durability than a single cell into which the MEAs of Comparative Examples 1 to 11 are incorporated.

Further, it is clear that both of the voltage and durability are good when the average thickness of the A1 layer is larger than the average thickness of the A2 layer, the A1 layer is in the range of 4 nm or more and 35 nm or less, the A2 layer is in the range of 2 nm or more and 34 nm or less, Rm (A1) is in the range of 0.10 or more and 1.0 or less, Rm (A2) is in the range of 0.01 or more and 0.45 or less, and Rm (A1)>Rm (A2).

Further, under the condition of producing the precursor by reactive sputtering of Ir and Ni in Example 1, simultaneous sputtering of Ir, Pt, and Ni was performed by adjusting the sputtering output using target so that the noble metal amount was Ir of 30% and Ru of 70%. The sputtering conditions are shown in Table 3 (Examples 12 to 22, Comparative Examples 12 to 22). The sample subjected to simultaneous sputtering was subjected to the same acid treatment and heat treatment as in Example 1 to create MEA, and the electrolytic performance was evaluated as an evaluation cell. The obtained results are shown in Table 4.

The catalytic activity is improved by about 50 mV by adding Ru and thus, the evaluation standard at this point was set as: less than 1.85 V . . . A, 1.85 to 1.95 V . . . B, and greater than 1.95 V . . . C. The evaluation of endurance time was carried out as described above. As a result, the same performance as in Example 1 was obtained.

TABLE 3

| | Sputtering Conditions [W] | | | | | | | | Acid Treatment |
|---|---|---|---|---|---|---|---|---|---|
| | A1 Layer | | | | A2 Layer | | | | |
| | IrRu/W | IrRu/s | Ni/W | Ni/s | IrRu/W | IrRu/s | Ni/W | Ni/s | Time [Hour] |
| Example | | | | | | | | | |
| 12 | 100 | 180 | 750 | 180 | 25 | 180 | 50 | 180 | 1 |
| 13 | 50 | 360 | 190 | 360 | 220 | 20 | 45 | 20 | 1 |
| 14 | 25 | 720 | 940 | 720 | 50 | 90 | 700 | 90 | 1 |
| 15 | 25 | 1080 | 620 | 1080 | 50 | 90 | 700 | 90 | 1 |
| 16 | 20 | 270 | 2500 | 270 | 60 | 90 | 840 | 90 | 1 |
| 17 | 20 | 180 | 3500 | 180 | 20 | 90 | 280 | 90 | 1 |
| 18 | 30 | 1050 | 650 | 1050 | 29 | 1050 | 400 | 1050 | 1 |
| 19 | 30 | 1050 | 650 | 1050 | 150 | 120 | 2100 | 120 | 1 |
| 20 | 50 | 630 | 110 | 630 | 150 | 120 | 100 | 120 | 1 |
| 21 | 150 | 120 | 1700 | 120 | 30 | 150 | 120 | 150 | 1 |
| 22 | 100 | 180 | 750 | 180 | 45 | 100 | 160 | 100 | 1 |
| Comparative Example | | | | | | | | | |
| 12 | 100 | 180 | 750 | 180 | 50 | 90 | 40 | 90 | 0.2 |
| 13 | 100 | 180 | 750 | 180 | 50 | 90 | 200 | 90 | 10 |
| 14 | 100 | 180 | 750 | 180 | 50 | 90 | 150 | 90 | 0.5 |
| 15 | 100 | 180 | 750 | 180 | 50 | 90 | 20 | 90 | 0.5 |
| 16 | 200 | 180 | 1500 | 180 | 100 | 180 | 200 | 180 | 0.5 |
| 17 | 30 | 90 | 150 | 90 | 100 | 180 | 120 | 180 | 0.3 |
| 18 | 100 | 180 | 750 | 180 | 100 | 13.5 | 160 | 13.5 | 0.5 |
| 19 | 100 | 180 | 750 | 180 | 100 | 315 | 160 | 315 | 0.5 |
| 20 | 100 | 180 | 750 | 180 | 100 | 270 | 160 | 270 | 0.5 |
| 21 | 30 | 90 | 150 | 90 | 100 | 36 | 120 | 36 | 0.3 |
| 22 | 100 | 180 | 220 | 180 | 50 | 90 | 150 | 90 | 0.8 |

|  | Rm(A1) | Rm(A2) | Ave. Thickness A1 (nm) | Ave. Thickness A2(nm) | Voltage | Endurance Time |
|---|---|---|---|---|---|---|
| Example | | | | | | |
| 12 | 0.20 | 0.10 | 20 | 6 | A | A |
| 13 | 0.10 | 0.01 | 29 | 5 | B | B |
| 14 | 0.99 | 0.40 | 20 | 5 | B | A |
| 15 | 1.00 | 0.39 | 29 | 5 | B | A |
| 16 | 0.99 | 0.40 | 6 | 6 | B | A |
| 17 | 0.97 | 0.38 | 4 | 2 | B | A |
| 18 | 1.00 | 0.40 | 35 | 33 | B | A |
| 19 | 1.00 | 0.40 | 35 | 20 | B | A |
| 20 | 0.10 | 0.02 | 34 | 19 | B | B |
| 21 | 0.30 | 0.20 | 20 | 5 | A | A |
| 22 | 0.20 | 0.19 | 20 | 5 | A | A |
| Comparative Example | | | | | | |
| 12 | 1.21 | 0.40 | 20 | 5 | C | A |
| 13 | 0.05 | 0.01 | 19 | 5 | C | A |
| 14 | 1.00 | 0.50 | 19 | 5 | B | C |
| 15 | 0.10 | 0.005 | 20 | 5 | B | C |
| 16 | 0.99 | 0.40 | 40 | 20 | C | A |
| 17 | 1.00 | 0.39 | 3 | 20 | B | C |
| 18 | 0.99 | 0.40 | 20 | 1.5 | C | C |
| 19 | 1.00 | 0.40 | 21 | 35 | A | C |
| 20 | 0.98 | 0.40 | 20 | 30 | C | A |
| 21 | 0.95 | 0.49 | 3 | 4 | A | C |
| 22 | 0.30 | 0.40 | 21 | 5 | C | C |

Rm (A1): Non-noble metal/noble metal atom ratio of A1
Rm (A2): Non-noble metal/noble metal atom ratio of A2

According to some embodiments, as described above, a catalyst laminate and a membrane electrode assembly that are structurally stable and have high durability even in a long-term operation with a small amount of noble metal can be provided. At the same time, an electrochemical cell and a stack adopting the catalyst laminate and the membrane electrode assembly can exhibit high stability and high durability.

Here, some elements are expressed only by element symbols thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A catalyst laminate comprising a plurality of catalyst layers, comprising:
    a first catalyst layer, wherein the first catalyst layer contains a noble metal or a noble metal oxide and a non-noble metal or a non-noble metal oxide;
    a second catalyst layer, wherein the second catalyst layer contains a noble metal or a noble metal oxide and a non-noble metal or a non-noble metal oxide; and
    a third catalyst layer, wherein the third catalyst layer contains a noble metal or a noble metal oxide and a non-noble metal or a non-noble metal oxide,
    wherein, in an atomic percent of the noble metal obtained by using a line analysis by energy dispersive X-ray spectroscopy in a thickness direction of the catalyst laminate,
    wherein the first catalyst layer has an atomic percent of the noble metal less than an average of a highest value and a lowest value of the atomic percent of the noble metal of the catalyst laminate,
    wherein the second catalyst layer has an atomic percent of the noble metal equal to or greater than the average of the highest value and the lowest value of the atomic percent of the noble metal of the catalyst laminate,
    wherein the third catalyst layer has an atomic percent of the noble metal less than an average of a highest value and a lowest value of the atomic percent of the noble metal of the catalyst laminate,
    wherein the second catalyst layer is present between the first catalyst layer and third catalyst layer,
    wherein, when a value obtained by dividing an atomic percent of the non-noble metal of the first catalyst layer by an atomic fraction of the noble metal of the first catalyst layer and the third catalyst layer is Rm (A1) and a value obtained by dividing the atomic percent of the non-noble metal of the second catalyst layer by the atomic fraction of the noble metal of the second catalyst layer is Rm (A2), Rm (A1)>Rm (A2),
    wherein pillars connecting the first catalyst layer and the third catalyst layer are present in the second catalyst layer,
    wherein the pillars contain the noble metal contained in the second catalyst layer,
    wherein the first catalyst layer, the second catalyst layer, and the third catalyst layer are stacked in this order,
    wherein the first catalyst layer is in direct contact with the second catalyst layer,
    wherein the third catalyst layer is in direct contact with the second catalyst layer,
    wherein a top of the pillars is in direct contact with the first catalyst layer, and
    wherein a bottom of the pillars is in direct contact with the third catalyst layer.

2. The catalyst laminate according to claim 1, wherein the Rm (A1) is 0.1 or more and 1.0 or less, and
    wherein the Rm (A2) is 0.01 or more and 0.45 or less.

3. The catalyst laminate according to claim 1, wherein an average thickness of the first catalyst layer is larger than that of the second catalyst layer.

4. The catalyst laminate according to claim 1, wherein an average thickness of the first catalyst layer is 4 nm or more and 35 nm or less, and
    wherein an average thickness of the second catalyst layer is 2 nm or more and 34 nm or less.

5. The catalyst laminate according to claim 1, wherein the first catalyst layer comprises a first area, wherein on 30% or more and less than 90% of the first area, no catalyst is present, and
    wherein the third catalyst layer comprises a second area, wherein on 30% or more and less than 90% of the second area, no catalyst is present.

6. The catalyst laminate according to claim 1, wherein the noble metal of the first catalyst layer or its oxide of the first catalyst layer contains one selected from a group including Ir, Pt, Ru, Rh, Os, Pd, and Au and the non-noble metal of the first catalyst layer or its oxide of the first catalyst layer contains one selected from a group including Fe, Co, Ni, Mn, Al, Zn, Ta, W, Hf, Si, Mo, Ti, Zr, Nb, V, Cr, Sn, and Sr,
    wherein the noble metal of the second catalyst layer or its oxide of the second catalyst layer contains one selected from a group including Ir, Pt, Ru, Rh, Os, Pd, and Au and the non-noble metal of the second catalyst layer or its oxide of the second catalyst layer contains one selected from a group including Fe, Co, Ni, Mn, Al, Zn, Ta, W, Hf, Si, Mo, Ti, Zr, Nb, V, Cr, Sn, and Sr, and wherein the noble metal of the third catalyst layer or its oxide of the third catalyst layer contains one selected from a group including Ir, Pt, Ru, Rh, Os, Pd, and Au and the non-noble metal of the third catalyst layer or its oxide of the third catalyst layer contains one selected from a group including Fe, Co, Ni, Mn, Al, Zn, Ta, W, Hf, Si, Mo, Ti, Zr, Nb, V, Cr, Sn, and Sr.

7. The catalyst laminate according to claim 1, wherein a gap exists between the pillars.

8. A membrane electrode assembly comprising the catalyst laminate according to claim 1.

9. An electrochemical cell comprising the membrane electrode assembly according to claim 8.

10. A stack comprising the electrochemical cell according to claim 9.

11. A water electrolyzer using the stack according to claim 10.

12. A hydrogen utilizing system comprising the electrochemical cell according to claim 9.

13. A hydrogen utilizing system comprising the stack according to claim 10.

14. A hydrogen utilizing system comprising the water electrolyzer according to claim 11.

15. A catalyst laminate comprising a plurality of catalyst layers, comprising:
a first catalyst layer, wherein the first catalyst layer contains a noble metal or a noble metal oxide and a non-noble metal or a non-noble metal oxide;
a second catalyst layer, wherein the second catalyst layer contains a noble metal or a noble metal oxide and a non-noble metal or a non-noble metal oxide; and
a third catalyst layer, wherein the third catalyst layer contains a noble metal or a noble metal oxide and a non-noble metal or a non-noble metal oxide,
wherein, in an atomic percent of the noble metal obtained by using a line analysis by energy dispersive X-ray spectroscopy in a thickness direction of the catalyst laminate,
wherein the first catalyst layer has an atomic percent of the noble metal less than an average of a highest value and a lowest value of the atomic percent of the noble metal of the catalyst laminate,
wherein the second catalyst layer has an atomic percent of the noble metal equal to or greater than the average of the highest value and the lowest value of the atomic percent of the noble metal of the catalyst laminate,
wherein the third catalyst layer has an atomic percent of the noble metal less than an average of a highest value and a lowest value of the atomic percent of the noble metal of the catalyst laminate,
wherein the second catalyst layer is present between the first catalyst layer and the third catalyst layer,
wherein, when a value obtained by dividing an atomic percent of the non-noble metal of the first catalyst layer by an atomic fraction of the noble metal of the first catalyst layer and the third catalyst layer is Rm (A1) and a value obtained by dividing the atomic percent of the non-noble metal of the second catalyst layer by the atomic fraction of the noble metal of the second catalyst layer is Rm (A2), Rm (A1)>Rm (A2),
wherein pillars connecting the first catalyst layer and the third catalyst layer are present in the second catalyst layer,
wherein the pillars contain the noble metal contained in the second catalyst layer,
wherein the first catalyst layer, the second catalyst layer, and the third catalyst layer are stacked in this order,
wherein the first catalyst layer is in direct contact with the second catalyst layer,
wherein the third catalyst layer is in direct contact with the second catalyst layer, and
wherein a gap exists between the pillars.

16. The catalyst laminate according to claim 15, wherein a top of the pillars is in direct contact with a surface of the first catalyst layer,
wherein a bottom of the pillars is in direct contact with a surface of the third catalyst layer, and
wherein a surface of the first catalyst layer faces a surface of the third catalyst layer.

17. The catalyst laminate according to claim 15, wherein the Rm (A1) is 0.1 or more and 1.0 or less, and
wherein the Rm (A2) is 0.01 or more and 0.45 or less.

18. The catalyst laminate according to claim 15, wherein an average thickness of the first catalyst layer is 4 nm or more and 35 nm or less, and
wherein an average thickness of the second catalyst layer is 2 nm or more and 34 nm or less.

19. The catalyst laminate according to claim 15, wherein a top region of the pillar is in direct contact with the first catalyst layer, and
wherein bottom region of the pillar is in direct contact with the third catalyst layer.

20. The catalyst according to claim 15, wherein the gap exists around an entire side surface of the pillars.

21. A membrane electrode assembly comprising the catalyst laminate according to claim 15.

22. An electrochemical cell comprising the membrane electrode assembly according to claim 20.

23. A stack comprising the electrochemical cell according to claim 21.

24. A water electrolyzer using the stack according to claim 22.

25. A hydrogen utilizing system comprising the electrochemical cell according to claim 21.

26. A hydrogen utilizing system comprising the stack according to claim 22.

* * * * *